(12) United States Patent
Kaiser et al.

(10) Patent No.: US 8,164,864 B2
(45) Date of Patent: Apr. 24, 2012

(54) METHOD AND SYSTEM FOR FABRICATING MAGNETIC TRANSDUCERS WITH IMPROVED PINNING

(75) Inventors: Christian Kaiser, San Jose, CA (US); Laurence L. Chen, Hayward, CA (US); Qunwen Leng, Palo Alto, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 357 days.

(21) Appl. No.: 12/504,030

(22) Filed: Jul. 16, 2009

(65) Prior Publication Data

US 2011/0013317 A1    Jan. 20, 2011

(51) Int. Cl.
*G11B 5/127* (2006.01)
(52) U.S. Cl. .................................... 360/324.2
(58) Field of Classification Search ............... 360/128, 360/324.1, 324.11, 324.12, 324.2
See application file for complete search history.

(56) References Cited

U.S. PATENT DOCUMENTS

| | | | |
|---|---|---|---|
| 5,638,235 A | 6/1997 | Gill et al. | |
| 5,640,753 A | 6/1997 | Schultz et al. | |
| 5,666,246 A | 9/1997 | Gill et al. | |
| 6,151,193 A | 11/2000 | Terunuma et al. | |
| 6,271,997 B1 | 8/2001 | Gill | |
| 6,317,290 B1 | 11/2001 | Wang et al. | |
| 6,400,536 B1 * | 6/2002 | Gill | 360/324.12 |
| 6,447,935 B1 | 9/2002 | Zhang et al. | |
| 6,449,131 B2 * | 9/2002 | Guo et al. | 360/315 |
| 6,618,223 B1 | 9/2003 | Chen et al. | |
| 6,721,146 B2 | 4/2004 | Beach | |
| 6,738,237 B2 | 5/2004 | Gill | |
| 6,764,778 B2 | 7/2004 | Saito et al. | |
| 6,866,751 B2 | 3/2005 | Gill et al. | |
| 7,061,731 B2 | 6/2006 | Larson et al. | |
| 7,161,763 B2 | 1/2007 | Ho et al. | |
| 7,180,715 B2 | 2/2007 | Gill | |
| 7,230,845 B1 | 6/2007 | Wang et al. | |
| 7,411,765 B2 | 8/2008 | Childress et al. | |
| 7,423,849 B2 | 9/2008 | Gill | |
| 7,446,986 B2 * | 11/2008 | Araki et al. | 360/324.12 |
| 7,522,391 B2 * | 4/2009 | Freitag et al. | 360/324.12 |
| 2001/0021087 A1 * | 9/2001 | Guo et al. | 360/315 |
| 2003/0179500 A1 | 9/2003 | Gill et al. | |
| 2003/0179512 A1 | 9/2003 | Ju et al. | |
| 2004/0008536 A1 | 1/2004 | Garni et al. | |
| 2005/0018364 A1 | 1/2005 | Gill | |
| 2006/0028862 A1 | 2/2006 | Min et al. | |
| 2006/0077707 A1 | 4/2006 | Deak | |
| 2006/0198185 A1 | 9/2006 | Hiebert et al. | |
| 2006/0291107 A1 | 12/2006 | Sbiaa et al. | |
| 2007/0133133 A1 * | 6/2007 | Freitag et al. | 360/324.12 |
| 2008/0273380 A1 | 11/2008 | Diao et al. | |
| 2009/0002898 A1 | 1/2009 | Childress et al. | |

OTHER PUBLICATIONS

H. Jaffres, et al., "Angular dependence of the tunnel magnetoresistance in transition-metal-based junctions", Physical Review B, vol. 64, 064427 (2001), 7 pages.

* cited by examiner

*Primary Examiner* — Allen Cao

(57) ABSTRACT

A method and system for providing a magnetic transducer are disclosed. The method and system include providing a magnetic element that includes a free layer, a pinned layer, and a nonmagnetic spacer layer between the free layer and the pinned layer. The nonmagnetic spacer layer is a tunneling barrier layer. The free layer is configured to be biased in a first direction. The pinned layer has a pinned layer magnetization configured to be pinned in a second direction that is at a first angle from perpendicular to the ABS. The first angle is non-zero and different from ninety degrees. The second direction and the first direction form a second angle that is different from ninety degrees.

29 Claims, 5 Drawing Sheets

Plan View

Plan View

ABS View

Plan View

Plan View

Plan View

Plan View

METHOD AND SYSTEM FOR FABRICATING MAGNETIC TRANSDUCERS WITH IMPROVED PINNING

BACKGROUND

FIG. 1 depicts a portion of a conventional read transducer 50 from the air-bearing surface (ABS) and from above. The conventional transducer 50 is a read transducer that includes a read sensor 52 and hard bias structures 64. The read sensor includes an AFM layer 54, a pinned layer that is a synthetic antiferromagnetic (SAF) layer 56, a nonmagnetic spacer layer 58, a free layer 60, and a capping layer 62. The SAF 56 includes a ferromagnetic layer (pinned layer) adjoining the AFM 54, a ferromagnetic (reference) layer and a nonmagnetic spacer layer between the pinned and reference layers. For simplicity, the pinned and reference layers are not separately depicted in FIG. 1. However, the magnetizations 55 and 57 of the pinned and reference layers, respectively, are separately shown. The magnetizations 55 and 57 are pinned perpendicular to the ABS (into or out of the plane of the page in the ABS view). The free layer 60 has a magnetization 61 biased by the magnetizations 65 of the hard bias structures 64. For clarity, the orientation 53 of the AFM layer 54 is also shown.

In operation, the read sensor 52 is exposed to an external magnetic field, for example from recording media (not shown). The external magnetic field may cause the free layer magnetization 61 to change direction. The free layer magnetization 61 would thus no longer be parallel to the hard bias magnetizations 65. As a result, the angle between the reference layer magnetization 57 (P2) and the free layer magnetization 61 changes. For low TMR, to a first approximation, the conductance of the read sensor 52 varies with the cosine of the angle between the magnetizations 57 and 61. More specifically, if $\theta$ is the angle between the reference layer magnetization 57 and the free layer magnetization 61, the conductance varies with $1+\frac{1}{2}*TMR*\cos\theta$, where TMR is the maximum tunneling magnetoresistance. Thus, to a first approximation, the resistance of the sensor 52 varies as $1/[1+TMR*\cos\theta/(2+TMR)]$.

Although the conventional read transducer 50 may function, there are drawbacks. It has been determined that for higher TMR, the response of a magnetic element such as the sensor 52 changes. In particular, first approximation for the transfer curve of such a magnetic element as varying with case is inaccurate. Accordingly, what is needed is an improved magnetic element that may be used as the read sensor 52.

SUMMARY

A method and system for providing a magnetic transducer are disclosed. The method and system include providing a magnetic element that includes a free layer, a pinned layer, and a nonmagnetic spacer layer between the free layer and the pinned layer. The nonmagnetic spacer layer is a tunneling barrier layer. The free layer is configured to be biased in a first direction. The pinned layer has a pinned layer magnetization configured to be pinned in a second direction that is at a first angle from perpendicular to the ABS. The first angle is nonzero and different from ninety degrees. The second direction and the first direction form a second angle that is different from ninety degrees.

DETAILED DESCRIPTION OF THE PREFERRED EMBODIMENTS

As discussed above, the transfer curve of a magnetic element such as a conventional MR sensor 52 may change at higher TMR. It has been determined that these changes may adversely affect the performance of the magnetic transducer 50. In particular, the conventional read sensor 52 may have limited utility at higher TMR. For higher TMR, the response of the read transducer 52 may not be symmetric for bits having opposite magnetizations. Furthermore, the magnitude of the response may be reduced. Stated differently, the sensitivity of the conventional read transducer 50 may be reduced. It has been determined that these losses may be due to the changes in the transfer curve for the sensor 52 at higher TMR. Accordingly, an improved read transducer has been developed.

Figure 1:
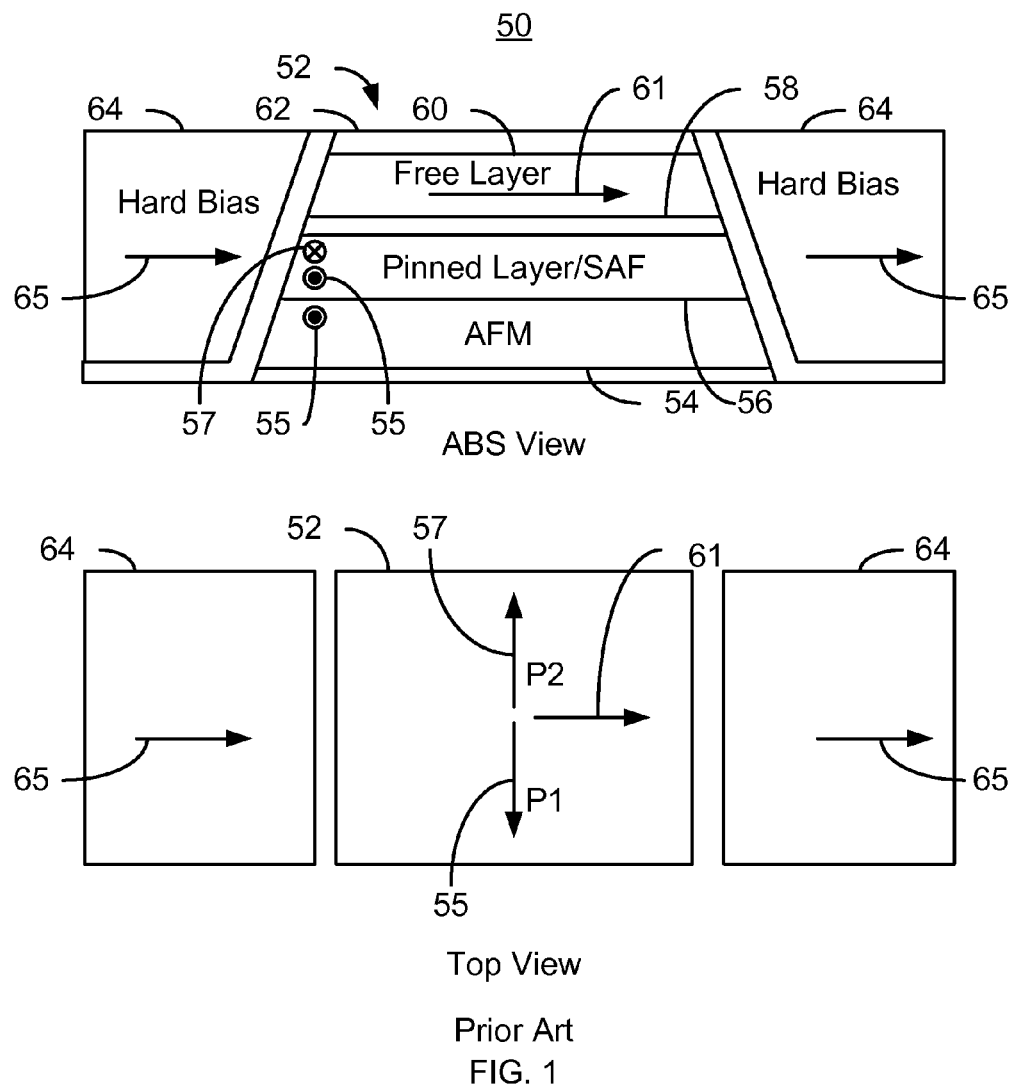
FIG. 1 depicts ABS and top views of a conventional TMR sensor and associated hard bias structures in a read transducer.
Figure 2:
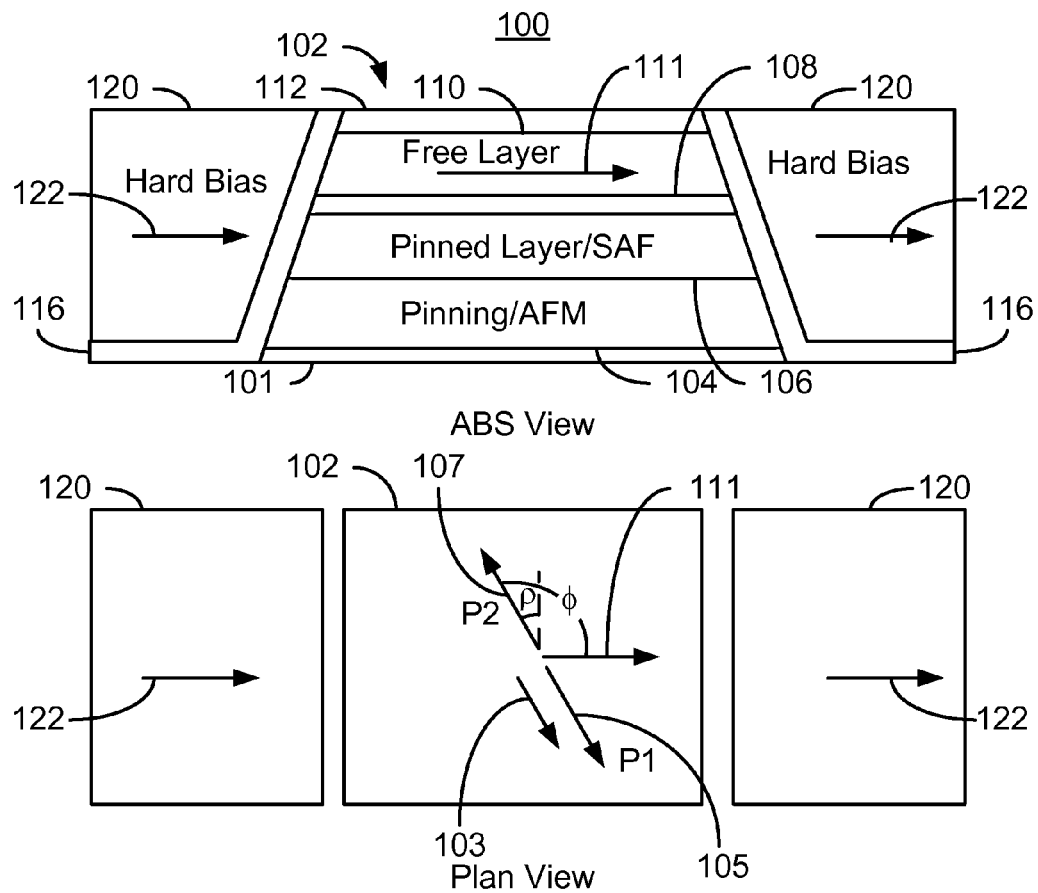
FIG. 2 depicts ABS and plan views of an exemplary embodiment of a transducer.

FIG. 2 depicts ABS and plan views of an exemplary embodiment of a transducer 100 at equilibrium. For clarity, FIG. 2 is not to scale. The read transducer 100 includes read sensor 102 and hard bias structures 120. The read transducer 100 may be part of a merged head including at least one write transducer (not shown) and/or may include other read transducers. The read transducer 100 may also reside on a slider (not shown) and be part of a disk drive.

In the embodiment shown, the read sensor 102 is a current-perpendicular-to-plane (CPP) sensor. Stated differently, current is driven substantially between the top and the bottom of the read sensor 102 as shown in the ABS view of FIG. 2. Consequently, insulator 116 resides between the read sensor 102 and the hard bias structures 120.

The read sensor 102 includes at least the free layer 110, nonmagnetic spacer layer 108, and pinned layer 106, which are shown as individual layers in the ABS view. Also shown in the ABS view is the pinning layer 104, which may be an AFM layer. Also shown are seed layer 101 and capping layer 112. In other embodiments, additional layers might be included. Although depicted as single layers, the free layer 110, nonmagnetic spacer layer 108, pinned layer 106 and pinning layer 104 may include substructures including but not limited to sub-layers. The free layer 110 has a free layer magnetization 111. In the embodiment shown, the free layer magnetization 111 is biased by the hard bias magnetization 122. However, in another embodiment, the free layer magnetization 111 may be biased in another manner or may be biased by a combination of the hard bias magnetization 122 and another feature. In the embodiment shown, the free layer magnetization 111 may lie within the ABS. However, as described below, in another embodiment, the free layer may not be parallel to the ABS. The nonmagnetic spacer layer 108 is a tunneling barrier layer. Thus, in some embodiments, the nonmagnetic spacer layer 108 may be a thin insulating layer.

In the embodiment shown, the pinned layer 108 may be a SAF. However, in another embodiment, the pinned layer 108 may be another type of layer. For example, the pinned layer 108 may be a simple layer. In such an embodiment, the magnetization of the pinned layer 108 may be considered to be P2 107 for the ensuing discussion. In the embodiment shown in FIG. 2, the pinned layer 108 includes ferromagnetic layers separated by a nonmagnetic spacer layer. For simplicity, these layers are not separately shown in FIG. 2. The magnetizations 105 and 107 of the ferromagnetic layers are shown in the plan view. The magnetization P1 105 is for the ferromagnetic layer closer to the pinning layer 104. The magnetization P2 107 is the magnetization of the reference layer, which is closest to the free layer 110. Also shown in the plan view are the free layer magnetization 111, hard bias magnetizations 122, and orientation 103 of the pinning layer 104.

As can be seen in FIG. 2, the pinned layer magnetizations 105 and 107 are not oriented perpendicular to the ABS. Instead, a nonzero angle, $\rho$, is between the magnetization P2 107 and normal to the ABS. A similar angle would be made between P1 105 and normal to the ABS. In one embodiment, the magnitude of $\rho$ does not exceed fifty degrees. Stated differently, in such embodiments, $\rho$ would be not more than fifty degrees clockwise or counter clockwise from perpendicular to the ABS. In some such embodiments, $\rho$ does not exceed thirty five degrees. In some embodiments, $\rho$ is also at least fifteen degrees. Further, the magnetizations 105 and 107 of the pinned layer 108 are not perpendicular to the free layer magnetization 111. Instead, P2 107 forms an angle, $\phi$, with the free layer magnetization 111 when the transducer 100 is not exposed to an external field, for example from a recording media. In the embodiment shown in FIG. 2, the angle $\phi$ is greater than ninety degrees. However, in another embodiment, $\phi$ may be less than ninety degrees.

In operation, the free layer magnetization 111 may change in response to the magnetic field due to data recorded on a media (not shown). A change in direction of the free layer magnetization 111 results in a change in the equilibrium angle, $\phi$, between the P2 107 and the free layer magnetization 111. As a result, the resistance of the read sensor 102 changes. Thus, data may be read from the media.

Performance of the read sensor 102 may be improved, particularly for high TMR by selection of the angles $\phi$ and $\rho$ at which the read sensor 102 is at equilibrium. In particular, by adjusting the angle, $\phi$, the response of the read sensor 102 may be modified. The adjustment to $\phi$ may be based on one or more of the shape of the transfer curve and the TMR of the read sensor 102. In the embodiment shown in FIG. 2, $\phi$ is changed by changing $\rho$, the angle the pinned layer magnetizations 105 and 107 make with normal to the ABS. The point on the transfer curve at which the read sensor 102 operates may be changed by tailoring $\phi$. As a result, the amplitude of the signal due to a bit being read may be increased. Consequently, performance of the read transducer 100 may be improved. Similarly, the symmetry of the response of the read sensor 102 may be tailored. By adjusting the angle $\phi$, the read sensor 102 may be operated in a region which is more or less symmetric in the absence of other influences on the read sensor 102. For example, in some embodiments, the external magnetic fields or other factors which might influence the response of the read sensor 102 are at or near zero. In such embodiments, the angle $\phi$ may be selected so that the response of the read sensor 102, and thus the transducer 100, is symmetric for opposite magnetizations being read. In another example, the angle $\phi$ might be selected so that the response of the read sensor 102 itself is less symmetric. Stated differently, the read sensor 102 may be operated at a point in its transfer curve that is less symmetric than, for example, where $\phi$ is ninety degrees. The asymmetry due to the angle $\phi$ may be used to account for other asymmetries, for example magnetic fields due to poles (not shown) or other structures in a head of which the read transducer 100 is a part. Thus, by modifying the angles $\rho$ and $\phi$, the response of the read sensor 102 may be customized for use in the desired read transducer. Thus performance of the read transducer 100 may be improved.

Figure 3:
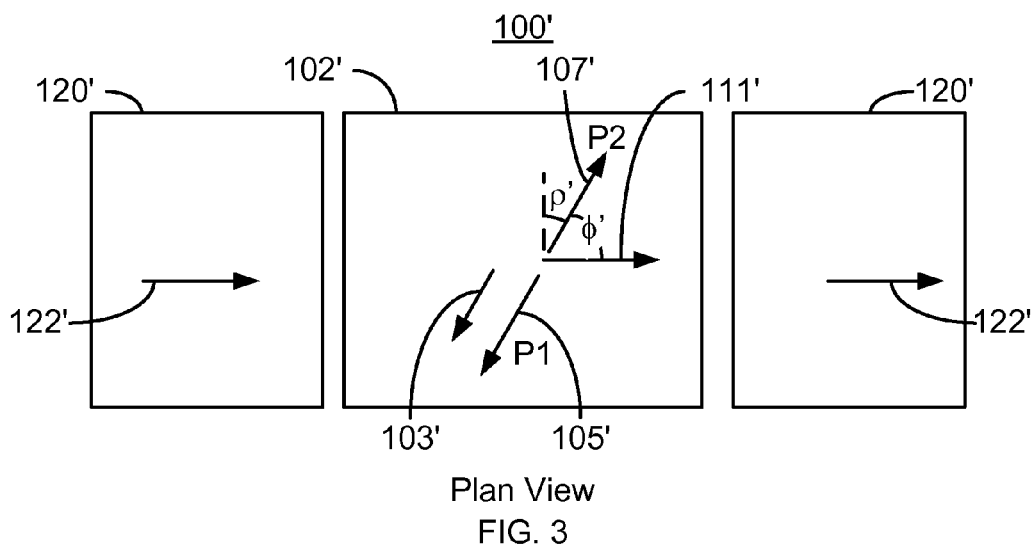
FIG. 3 depicts a plan view of the exemplary embodiment of a transducer.

FIG. 3 depicts a plan view of another exemplary embodiment of a transducer 100'. For clarity, FIG. 3 is not to scale. The read transducer 100' may be part of a merged head including at least one write transducer (not shown) and/or may include other read transducers. The read transducer 100' may also reside on a slider (not shown) and be part of a disk drive. The read transducer 100' is analogous to the read transducer 100. The read transducer includes read sensor 102' and hard bias structures 120' that are analogous to the read sensor 102 and hard bias structures 120, respectively. Thus, the read sensor 102' would include at least a free layer, nonmagnetic spacer layer that may be a tunneling barrier layer, and pinned layer/SAF analogous to the layers 110, 108, and 106, respectively, of the sensor 102. Further, a pinning layer analogous to the pinning layer 104 may also be included in the read sensor 102'. FIG. 3 depicts the magnetizations 105' and 107' of the ferromagnetic layer closest to the pining layer and the reference layer of the pinned layer, respectively. Also shown are the free layer magnetization 111', the hard bias magnetizations 122', and the orientation 103' of the pinning layer.

As can be seen in FIG. 3, the pinned layer magnetizations 105' and 107' are neither perpendicular to the ABS nor perpendicular to the free layer magnetization 111'. Instead, a nonzero angle, $\rho'$ is between the magnetization P2 107' and perpendicular to the ABS. A similar angle would be made between P1 105' and normal to the ABS. In one embodiment, the magnitude of $\rho'$ does not exceed fifty degrees. Stated differently, in such embodiments, $\rho'$ would be not be more than fifty degrees clockwise or counter clockwise from perpendicular to the ABS. In some such embodiments, $\rho'$ does not exceed thirty five degrees. In some embodiments, $\rho'$ is also at least fifteen degrees. P2 107' forms an angle, $\phi'$, with the free layer magnetization 111'. In the embodiment shown in FIG. 3, the angle $\phi'$ is less than ninety degrees. Further, the angle $\phi'$ may be considered to be negative as it is clockwise from perpendicular to the ABS, while $\phi$ is counterclockwise from perpendicular to the ABS. In operation, the read transducer 100' functions in an analogous manner to the read transducer 100.

Performance of the read transducer 100' may be improved, particularly for high TMR, by selection of the angles $\phi'$ and $\rho'$ at which the read sensor 102' is at equilibrium. The adjustment to $\phi'$ may be based on one or more of the shape of the transfer curve and the TMR of the read sensor 102'. In particular, by adjusting the angle, $\phi'$, the response of the read sensor 102' may be modified in a manner analogous to described above with respect to the read transducer 100. In particular, the amplitude of the signal from the read sensor 102' may be increased and the response of the read sensor 102' may be made more or less symmetric. As a result, the response of the read transducer 100' may be improved.

Figure 4:
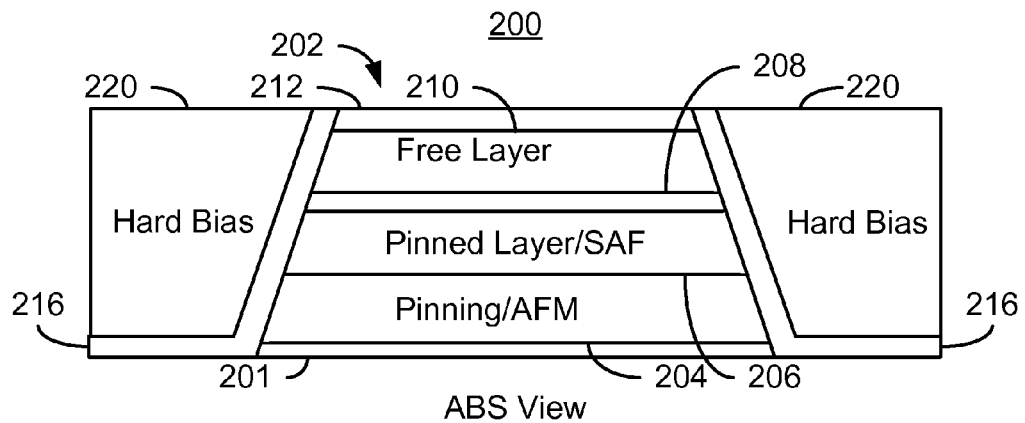
FIG. 4 depicts ABS and plan views of another exemplary embodiment of a transducer.
Figure 4:
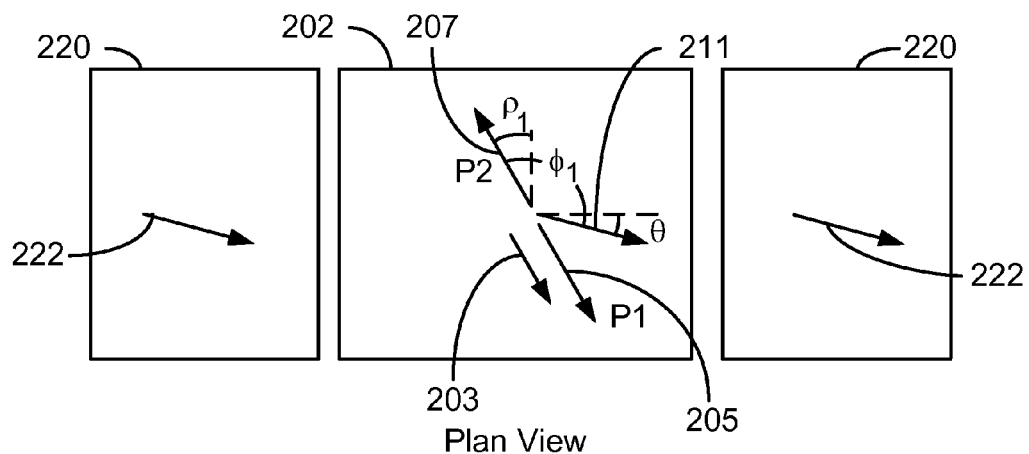

FIG. 4 depicts ABS and plan views of another exemplary embodiment of a transducer 200. For clarity, FIG. 4 is not to scale. The read transducer 200 includes read sensor 202 and hard bias structures 220. The read transducer 200 may be part of a merged head including at least one write transducer (not shown) and/or may include other read transducers. The read transducer 100 may also reside on a slider (not shown) and be part of a disk drive.

In the embodiment shown, the read sensor 202 is a CPP sensor. Stated differently, current is driven substantially between the top and the bottom of the read sensor 202 as shown in FIG. 4. Consequently, insulator 216 resides between the read sensor 202 and the hard bias structures 220. The read transducer 200 and read sensor 202 are analogous to the read transducers 100/100' and read sensor 102/102', respectively. Thus, the read transducer 200 operates in an analogous manner to the read transducers 100/100'.

The read transducer 202 includes at least the free layer 210, nonmagnetic spacer layer 208, and pinned layer 206, which are shown as individual layers in the ABS view. Also shown in the ABS view is the pinning layer 204, which may be an AFM layer. Also shown are seed layer 201 and capping layer 212. Thus, the read transducer 200 and read sensor 202 are analogous to the read transducers 100/100' and read sensor 202/202' depicted in FIGS. 2-3. Although depicted as single layers, the free layer 210, nonmagnetic spacer layer 208, pinned layer 206 and pinning layer 204 may include substructures including but not limited to sub-layers. The free layer 210 has a free layer magnetization 211. In the embodiment shown, the free layer magnetization 211 is biased by the hard bias magnetization 222. However, in another embodiment, the free layer magnetization 211 may be biased in another manner or may be biased by a combination of the hard bias magnetization 222 and another feature. The nonmagnetic spacer layer 208 is a tunneling barrier layer. Thus, in some embodiments, the nonmagnetic spacer layer 208 may be a thin insulating layer.

In the embodiment shown, the pinned layer 208 may be a SAF. However, in another embodiment, the pinned layer 208 may be another type of layer. For example, the pinned layer 208 may be a simple layer. In such an embodiment, the magnetization of the pinned layer 208 may be considered to be P2 207 for the ensuing discussion. In the embodiment shown in FIG. 4, the pinned layer 208 includes ferromagnetic layers separated by a nonmagnetic spacer layer. For simplicity, these layers are not separately shown in FIG. 4. The magnetizations 205 and 207 of the ferromagnetic layers are shown in the plan view. The magnetization P1 205 is for the ferromagnetic layer closer to the pinning layer 204. The magnetization P2 207 is the magnetization of the reference layer, which is closest to the free layer 210. Also shown in the plan view are the free layer magnetization 211, hard bias magnetizations 222, and orientation 203 of the pinning layer 204.

As can be seen in FIG. 4, the pinned layer magnetizations 205 and 207 are not oriented perpendicular to the ABS. Instead, a nonzero angle, $\rho_1$, is between the magnetization P2 207 and perpendicular to the ABS. A similar angle would be made between P1 205 and normal to the ABS. In one embodiment, the magnitude of $\rho_1$ does not exceed fifty degrees. Stated differently, in such embodiments, $\rho_1$ would be not more than fifty degrees clockwise or counter clockwise from perpendicular to the ABS. In some such embodiments, $\rho_1$ does not exceed thirty five degrees. In some embodiments, $\rho_1$ is also at least fifteen degrees. Further, free layer magnetization 211 is not parallel to the ABS, which is different than the embodiment of the read transducer 100/100' shown in FIGS. 2-3. Instead, a component of the free layer magnetization 211, and thus the hard bias magnetizations 222, are perpendicular to the ABS. Stated differently, the free layer magnetization 211, as well as the hard bias magnetizations 222, form a nonzero angle, $\theta$, with the ABS. Thus, the magnetizations 205 and 207 of the pinned layer 208 are not perpendicular to the free layer magnetization 211. Instead, P2 207 forms an angle, $\phi_1$, with the free layer magnetization 211. In the embodiment shown in FIG. 4, the angle $\phi_1$ is greater than ninety degrees. However, in another embodiment, $\phi_1$ may be less than ninety degrees.

Performance of the read transducer 200 may be improved in an analogous manner to the transducers 100 and 100'. In particular, by adjusting the angles $\rho_1$, $\theta$, and thus $\phi_1$, the response of the read sensor 202 may be customized. The adjustment to $\phi_1$ may be based on one or more of the shape of the transfer curve and the TMR of the read sensor 202. In particular, the magnitude of the signal may be enhanced, the symmetry of response decreased or increased. As a result, the performance of the read transducer 200 may be improved.

Figure 5:
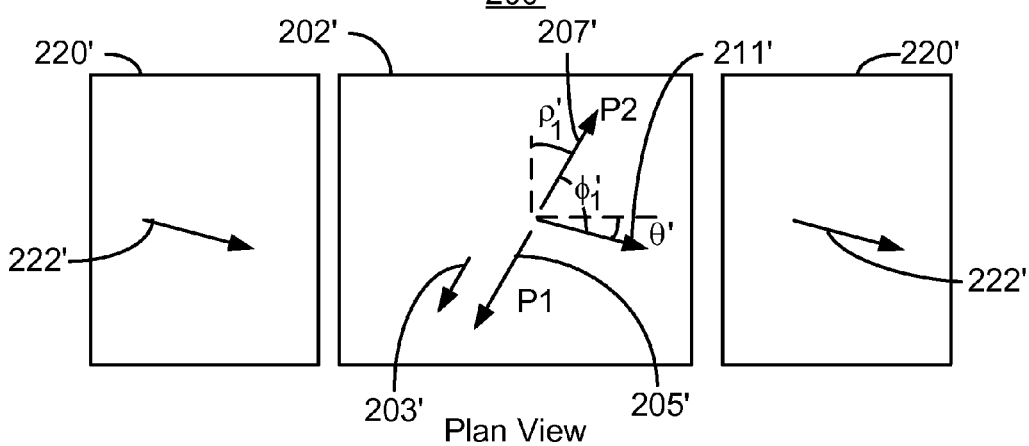
FIG. 5 depicts a plan view of another exemplary embodiment of a transducer.

FIG. 5 depicts a plan view of another exemplary embodiment of a transducer 200'. For clarity, FIG. 5 is not to scale. The read transducer 200' may be part of a merged head including at least one write transducer (not shown) and/or may include other read transducers. The read transducer 200' may also reside on a slider (not shown) and be part of a disk drive. The read transducer 200' is analogous to the read transducer 200. The read transducer 200' includes read sensor 202' and hard bias structures 220' that are analogous to the read sensor 202 and hard bias structures 220, respectively. Thus, the read sensor 202' would include a free layer, nonmagnetic spacer layer that may be a tunneling barrier layer, and pinned layer/SAF analogous to the layers 210, 208, and 206, respectively, of the sensor 202. Further, a pinning layer analogous to the pinning layer 204 may also be included in the read sensor 202'. FIG. 5 depicts the magnetizations 205' and 207' of the ferromagnetic layer closest to the pining layer and the reference layer of the pinned layer, respectively. Also shown are the free layer magnetization 211', the hard bias magnetizations 222', and the orientation 203' of the pinning layer. The read transducer 200' may thus operate in an analogous manner to the read transducer 200.

As can be seen in FIG. 5, the pinned layer magnetizations 205' and 207' are neither perpendicular to the ABS nor perpendicular to the free layer magnetization 211'. Instead, a nonzero angle, $\rho_1'$ is between the magnetization P2 107' and perpendicular to the ABS. A similar angle would be made between P1 105' and normal to the ABS. In one embodiment, the magnitude of $\rho_1'$ does not exceed fifty degrees. Stated differently, in such embodiments, $\rho_1'$ would be not more than fifty degrees clockwise or counter clockwise from perpendicular to the ABS. In some such embodiments, $\rho_1'$ does not exceed thirty five degrees. In some embodiments, $\rho_1'$ is also at least fifteen degrees. P2 107' forms an angle, $\phi_1'$, with the free layer magnetization 111'. In the embodiment shown in FIG. 3, the angle $\phi_1'$ is less than ninety degrees. In addition, the free layer magnetization 211' does not lie within the ABS. Instead, the free layer magnetization 211' is at an angle, $\theta'$, from the ABS.

Performance of the read transducer 200' may be improved, particularly for high TMR by selection of the angles $\rho_1'$, $\theta'$, and, therefore, $\phi_1'$. In particular, by adjusting the angle, $\phi_1'$, the response of the read sensor 202' may be modified in a manner analogous to described above with respect to the read transducer 200. The adjustment to $\phi_1'$ may be based on one or more of the shape of the transfer curve and the TMR of the read sensor 202'. In particular, the amplitude of the signal from the read sensor 202' may be improved and the response of the read sensor 102' may be made more or less symmetric. As a result, the response of the read transducer 200' may be improved.

Figure 6:
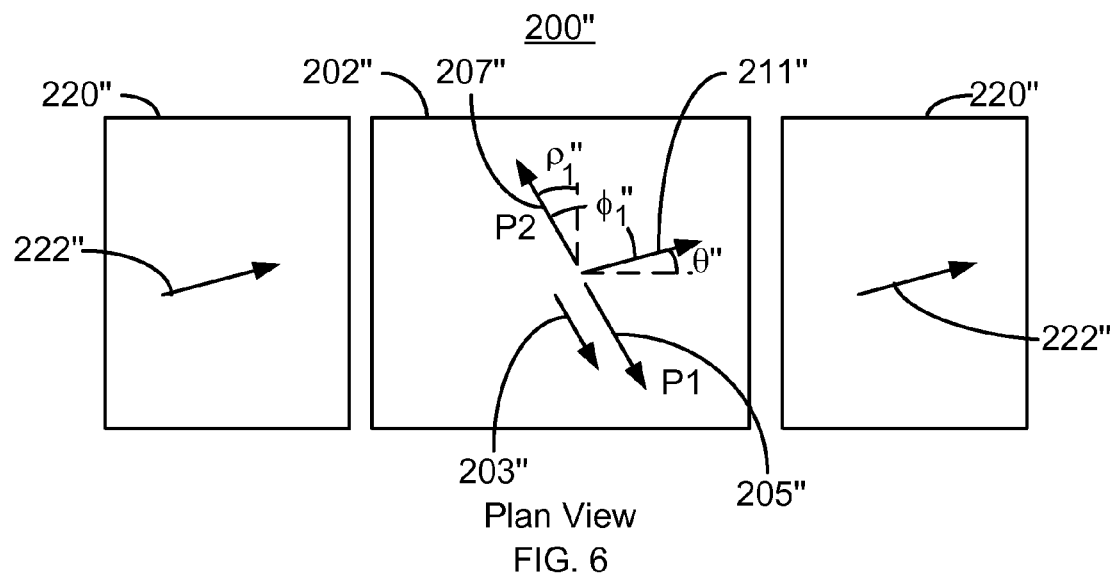
FIG. 6 depicts a plan view of another exemplary embodiment of a transducer.
Figure 7:
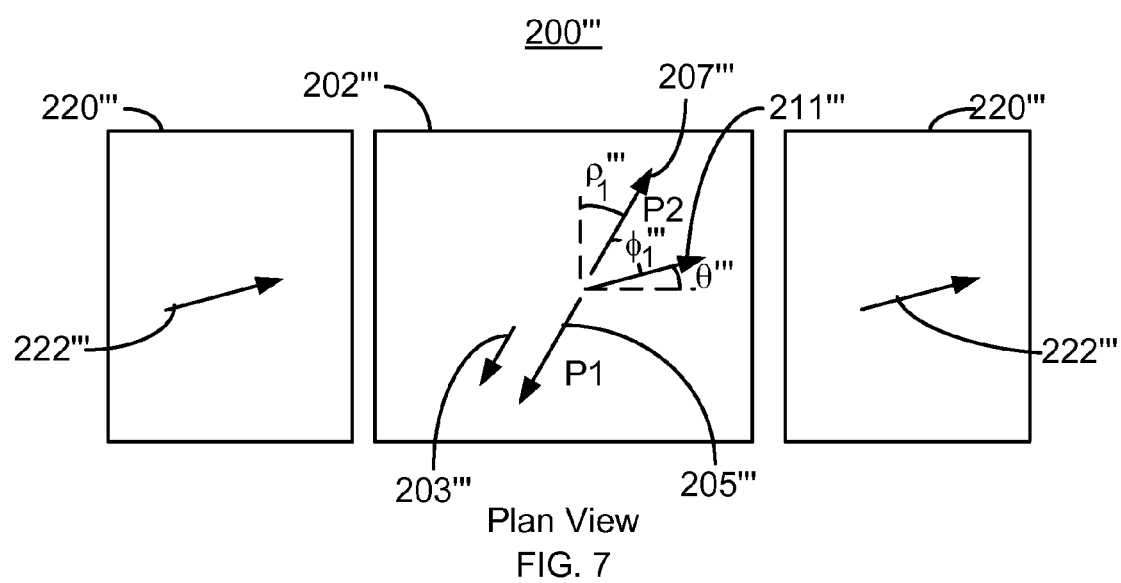
FIG. 7 depicts a plan view of another exemplary embodiment of a transducer.

FIGS. 6-7 depict plan views of exemplary embodiments of transducers 200" and 200'". For clarity, FIGS. 6-7 are not to scale. The read transducers 200" and 200'" may be part of merged heads including at least one write transducer (not shown) and/or may include other read transducers. The read transducers 200" and 200'" may also reside on a slider (not shown) and be part of a disk drive. The read transducers 200" and 200'" are analogous to the read transducer 200 and 200'. The read transducers 200"/200" includes read sensor 202"/200'" and hard bias structures 220"/220'" that are analogous to the read sensor 202/202' and hard bias structures 220/220', respectively. However, the orientations of the free layer magnetizations 211" and 211'" differ. In particular, the free layer magnetizations 211" and 211'" are oriented away from the ABS. The read transducer 200" and 200'" operate in a manner analogous to the read transducers 200 and 200'.

Thus, the pinned layer magnetizations 205"/205'" and 207"/207'" are neither perpendicular to the ABS nor perpendicular to the free layer magnetization 211"/211'". Instead, nonzero angles $\rho_1"/\rho_1'"$ is between the magnetization P2 207"/207'" and perpendicular to the ABS. A similar angle would be made between P1 205"/205'" and normal to the ABS. Further, there are nonzero angles, $\theta"/\theta'"$, between the ABS and the free layer magnetizations 211"/211'". In one embodiment, the magnitude of $\rho_1"/\rho_1'"$ does not exceed fifty degrees. Stated differently, in such embodiments, $\rho_1"/\rho_1'"$ would be not more than fifty degrees clockwise or counter clockwise from perpendicular to the ABS. In some such embodiments, $\rho_1"/\rho_1'"$ does not exceed thirty five degrees. In some embodiments, $\rho_1"/\rho_1'"$ is also at least fifteen degrees. P2 207"/207'" form angles, $\phi_1"/\phi_1'"$, with the free layer magnetization 211"/211'". In the embodiment shown in FIGS. 6-7, the angle $\phi_1"/\phi_1'"$ is different from ninety degrees.

Performance of the read transducers 200"/200" may be improved in an analogous manner to the transducers 100, 100', 200, and 200'. The adjustment to $\phi_1"/\phi_1'"$ may be based on one or more of the shape of the transfer curve and the TMR of the read sensor 202"/202". In particular, the amplitude of the signal from the read sensor 202"/202" may be improved and the response of the read sensor 202"/202" may be made more or less symmetric. As a result, the response of the read transducer 200"/200" may be improved.

Figure 8:
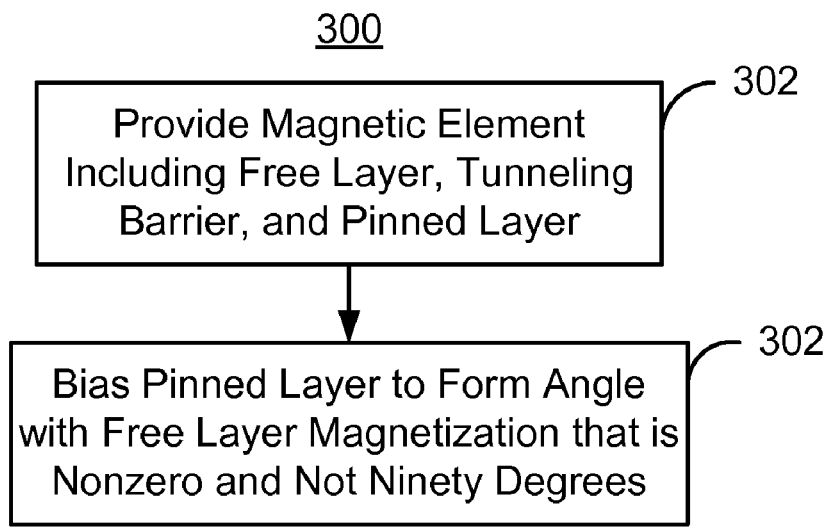
FIG. 8 is a flow chart depicting an exemplary embodiment of a method for fabricating a magnetic transducer.

FIG. 8 is a flow chart depicting an exemplary embodiment of a method 300 for fabricating a magnetic transducer. For simplicity, some steps may be omitted or combined. For clarity, the method 300 is described in the context of the transducers 100 and 200. However, the method may be used to fabricate other transducers including but not limited to the transducers 100', 200', 200", and 200'". Although described in the context of forming single transducers, the method 300 may be used to form multiple transducers.

A magnetic element 102/202 is provided, via step 302. The magnetic element includes at least one free layer 110/210, a pinned layer 106/206, and a nonmagnetic spacer layer 108/208 between the free layer 110/210 and the pinned layer 106/206. The free layer magnetization 111/211 is configured to be biased in a first direction, for example by hard bias structures 120/220. The pinned layer 106/206 has a pinned layer magnetization 107/207 and/or 105/205. Step 302 may include providing a SAF for the pinned layer, as well as providing a pinning layer. In some embodiments, step 302 may include blanket depositing the layers for the read sensors 102/202 and defining the read sensors 102/202 from these layers. In some embodiments, other structures, such as the hard bias structures 120/220 may also be provided.

The pinned layer magnetization 107/207 and/or 105/205 is biased, via step 304. The pinned layer 106/206 is biased such that the magnetization 105 or 107/205 or 207 forms an angle $\rho/\rho_1$ with perpendicular to the ABS and such that the magnetization 105 or 107/205 or 207 and the free layer magnetization 111/211 are not perpendicular. In some embodiments, step 304 is performed such that $\rho/\rho_1$ is not more than fifty degrees. In some embodiments, $\rho/\rho_1$ is at least fifteen degrees and not more than thirty-five degrees. In some embodiments, step 304 includes not only biasing the pinned layer magnetization 105 or 107/205 or 207 such that they are not perpendicular to the ABS. In some embodiments, the free layer magnetizations 111/211 are also biased so that they do not lie within the ABS.

Using the method 300, the transducer(s) 100 and/or 200 may be provided. Similarly, the method 300 may also be used to form transducer(s) 100', 200', 200", and or other transducers. Thus, read transducers having improved signal amplitude and symmetry may be fabricated.

Figure 9:
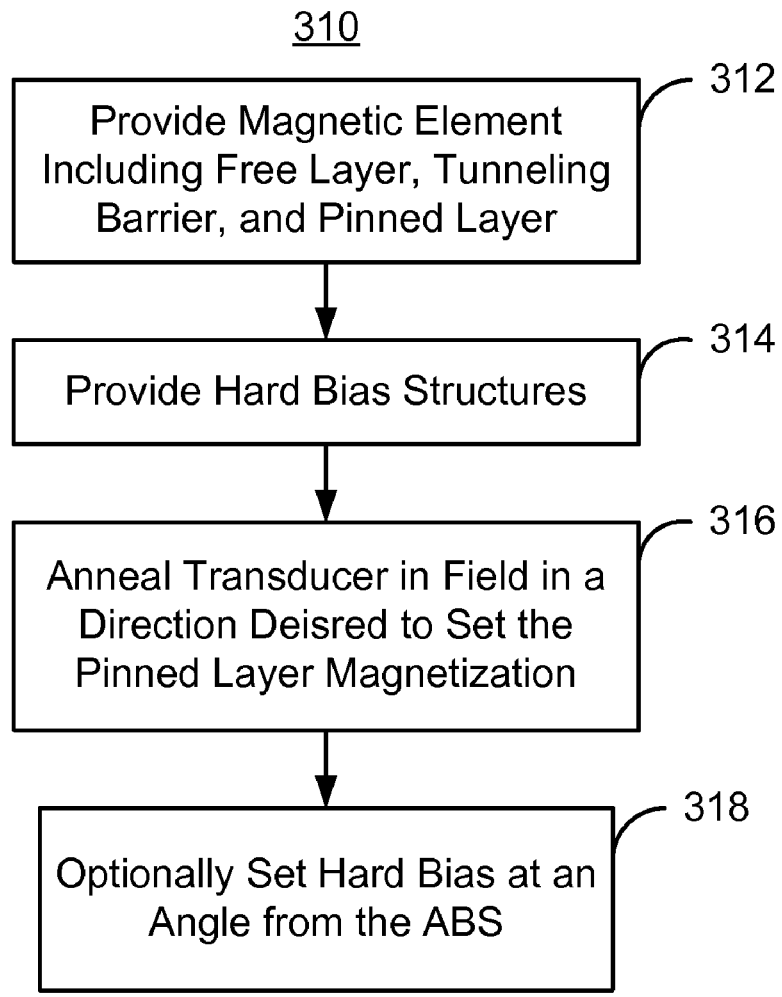
FIG. 9 is a flow chart depicting an exemplary embodiment of another method for fabricating a magnetic transducer.

FIG. 9 is a flow chart depicting an exemplary embodiment of another method 310 for fabricating a magnetic transducer. For simplicity, some steps may be omitted or combined. For clarity, the method 310 is described in the context of the transducers 100 and 200. However, the method may be used to fabricate other transducers including but not limited to the transducers 100', 200', 200", and 200'". Although described in the context of forming single transducers, the method 300 may be used to form multiple transducers.

A magnetic element 102/202 is provided, via step 312. The magnetic element includes at least one free layer 110/210, a pinned layer 106/206, and a nonmagnetic spacer layer 108/208 between the free layer 110/210 and the pinned layer 106/206. The free layer magnetization 111/211 is configured to be biased in a first direction, for example by hard bias structures 120/220. The pinned layer 106/206 has a pinned layer magnetization 107/207 and/or 105/205. Step 312 may include providing a SAF for the pinned layer, as well as providing a pinning layer. In some embodiments, step 312 may include blanket depositing the layers for the read sensors 102/202 and defining the read sensors 102/202 from these layers.

The hard bias structures 120/220 may be provided, via step 314. Step 314 may include blanket depositing the seed and other layers for the hard bias structures 120/220, then defining the hard bias structures 120/220 from these layers.

The transducer 100/200 is annealed in a sufficiently high magnetic field and at a sufficiently high temperature to pin the magnetizations 105/107 and 205/207, via step 316. The pinned layer 106/206 is thus biased such that the magnetization 105 or 107/205 or 207 forms an angle $\rho/\rho_1$ with perpendicular to the ABS. In some embodiments, step 316 is performed such that $\rho/\rho_1$ is not more than fifty degrees. In some embodiments, $\rho/\rho_1$ is at least fifteen degrees and not more than thirty-five degrees. In some embodiments, step 316 thus includes biasing the pinned layer magnetization 105 or 107/205 or 207 such that they are not perpendicular to the ABS.

The hard bias magnetizations 122/222 are set in the desired direction(s), via step 318. Step 318 may thus include applying a sufficiently high magnetic field in the desired direction for the free layer magnetization 111/211. In some embodiments, the free layer magnetizations 211 are also biased so that they do not lie within the ABS. Thus, using the step 316 and 318, the desired angle $\phi/\phi_1$ between the free layer magnetization 111/211 and the pinned layer magnetizations 107/207 may be obtained. Fabrication of the transducer 100/200 may then be completed.

Using the method 310, the transducer(s) 100 and/or 200 may be provided. Similarly, the method 310 may also be used to form transducer(s) 100', 200', 200", and or other transducers. Thus, read transducers having improved signal amplitude and symmetry may be fabricated.

We claim:

1. A magnetic recording transducer having an air-bearing surface (ABS) comprising:
    a magnetic element including a free layer, a pinned layer, and a nonmagnetic spacer layer between the free layer and the pinned layer, the nonmagnetic spacer layer being a tunneling barrier layer, the free layer being configured to be biased in a first direction, the pinned layer having a pinned layer magnetization configured to be pinned in a second direction, the second direction being at a first angle from perpendicular to the ABS;
    wherein the first angle is nonzero and different from ninety degrees and the second direction and the first direction form a second angle that is different from ninety degrees.

2. The magnetic recording transducer of claim 1 wherein the magnitude of the first angle is not more than fifty degrees.

3. The magnetic recording transducer of claim 2 wherein the magnitude of the first angle is at least fifteen and not more than thirty-five degrees.

4. The magnetic recording transducer of claim 1 further comprising a hard bias structure adjacent to the magnetic element and having a hard bias magnetization substantially along the first direction.

5. The magnetic recording transducer of claim 4 wherein the first direction makes a third angle with the ABS, the third angle being nonzero.

6. The magnetic transducer of claim 1 wherein the magnetoresistance of the magnetic element is characterized by a transfer curve and wherein the second angle is configured to decrease an asymmetry of the transfer curve.

7. The magnetic transducer of claim 1 wherein the magnetoresistance of the magnetic element is characterized by a transfer curve and wherein the second angle is configured to increase an asymmetry of the transfer curve.

8. The magnetic transducer of claim 1 wherein the second angle is configured based on a tunneling magnetoresistance of the magnetic element.

9. The magnetic transducer of claim 1 wherein the first direction is parallel to the ABS.

10. A magnetic recording transducer having an air-bearing surface (ABS) comprising:
    a magnetic element including a free layer, a pinned layer, and a nonmagnetic spacer layer between the free layer and the pinned layer, the nonmagnetic spacer layer being a tunneling barrier layer, the free layer being configured to be biased in a first direction, the pinned layer having a pinned layer magnetization configured to be pinned in a second direction, the second direction being at a first angle from perpendicular to the ABS;
    wherein the first angle is nonzero and different from ninety degrees and the second direction and the first direction form a second angle that is different from ninety degrees and wherein the pinned layer is a synthetic antiferromagnet (SAF) including a first ferromagnetic layer having a first magnetization, a second ferromagnetic layer having a second magnetization, and a nonmagnetic layer between the first ferromagnetic layer and the second ferromagnetic layer, the second ferromagnetic layer being a reference layer.

11. The magnetic recording transducer of claim 10 wherein the free layer has a free layer magnetization biased in the first direction and wherein free layer magnetization and the second magnetization form the second angle.

12. The magnetic recording transducer of claim 11 wherein the second angle is less than ninety degrees.

13. The magnetic transducer of claim 11 wherein the second angle is greater than ninety degrees.

14. A magnetic recording transducer having an air-bearing surface (ABS) comprising:
    a magnetic element including a free layer, a pinned layer, a nonmagnetic spacer layer between the free layer and the pinned layer, and a pinning layer adjacent to the pinned layer, the free layer having a free layer magnetization being configured to be biased parallel to a first direction, the pinned layer being a synthetic antiferromagnetic (SAF) including a first ferromagnetic layer adjoining the pinning layer, a second ferromagnetic layer and a nonmagnetic layer between the first ferromagnetic layer and the second ferromagnetic layer, the second ferromagnetic layer having a pinned layer magnetization pinned parallel to a second direction, the nonmagnetic spacer layer being a tunneling barrier layer, the second direction being at a first angle from perpendicular to the ABS, and the first angle having a magnitude of at least fifteen and not more than thirty-five degrees;
    a hard bias structure adjacent to the magnetic element and having a hard bias magnetization substantially along the first direction;
    wherein the second direction and the first direction form a second angle that is different from ninety degrees, and the first direction is a third angle from the ABS, the third angle being nonzero.

15. A disk drive comprising:
    a slider; and
    a magnetic recording transducer having an air-bearing surface (ABS) residing on the slider, the magnetic recording transducer including a magnetic element, the magnetic element including a free layer, a pinned layer, and a nonmagnetic spacer layer between the free layer and the pinned layer, the nonmagnetic spacer layer being a tunneling barrier layer, the free layer being configured to be biased in a first direction, the pinned layer having a pinned layer magnetization configured to be pinned in a second direction, the second direction being at a first angle from perpendicular to the ABS;
    wherein the first angle is nonzero and different from ninety degrees and the second direction and the first direction form a second angle that is different from ninety degrees.

16. A method for providing a magnetic recording transducer having an air-bearing surface (ABS) comprising:
    providing a magnetic element including a free layer, a pinned layer, and a nonmagnetic spacer layer between the free layer and the pinned layer, the free layer having a free layer magnetization configured to be biased in a first direction, the pinned layer having a pinned layer magnetization, the nonmagnetic spacer layer being a tunneling barrier layer; and
    biasing the pinned layer magnetization in a second direction at a first angle from perpendicular to the ABS, the first angle being nonzero and different from ninety degrees, the second direction and the first direction form a second angle that is different from ninety degrees.

17. The method of claim 16 further comprising
    providing a hard bias structure adjacent to the magnetic element and having a hard bias magnetization; and setting the hard bias magnetization substantially along the first direction.

18. The method of claim 17 wherein the first direction is not parallel to the ABS.

19. The method of claim 16 wherein the magnetoresistance of the magnetic element is characterized by a transfer curve and wherein the second angle is configured to decrease an asymmetry of the transfer curve.

20. The method of claim 16 wherein the magnetoresistance of the magnetic element is characterized by a transfer curve and wherein the second angle is configured to increase an asymmetry of the transfer curve.

21. The method of claim 16 wherein the second angle is configured based on a tunneling magnetoresistance of the magnetic element.

22. The method of claim 16 wherein the step of providing the magnetic element further includes providing a pinning layer for pinning the pinned layer magnetization, the step of biasing the pinned layer magnetization further including:
   setting an orientation of the pinning layer in the second direction.

23. The method of claim 22 wherein the magnitude of the first angle is not more than fifty degrees.

24. The method of claim 23 wherein the magnitude of the first angle is at least fifteen and not more than thirty-five degrees.

25. A method for providing a magnetic recording transducer having an air-bearing surface (ABS) comprising:
   providing a magnetic element including a free layer, a pinned layer, and a nonmagnetic spacer layer between the free layer and the pinned layer, the free layer having a free layer magnetization configured to be biased in a first direction, the pinned layer having a pinned layer magnetization, the nonmagnetic spacer layer being a tunneling barrier layer, wherein the step of providing the magnetic element further includes providing a pinning layer for pinning the pinned layer magnetization, the step of biasing the pinned layer magnetization further including setting an orientation of the pinning layer in the second direction wherein the setting step further includes:
   annealing the magnetic transducer in a magnetic field and at a temperature above room temperature, the magnetic field being in the second direction; and
   biasing the pinned layer magnetization in a second direction at a first angle from perpendicular to the ABS, the first angle being nonzero and different from ninety degrees, the second direction and the first direction form a second angle that is different from ninety degrees.

26. A method for providing a magnetic recording transducer having an air-bearing surface (ABS) comprising:
   providing a magnetic element including a free layer, a pinned layer, and a nonmagnetic spacer layer between the free layer and the pinned layer, the free layer having a free layer magnetization configured to be biased in a first direction, the pinned layer having a pinned layer magnetization, the nonmagnetic spacer layer being a tunneling barrier layer; and
   biasing the pinned layer magnetization in a second direction at a first angle from perpendicular to the ABS, the first angle being nonzero and different from ninety degrees, the second direction and the first direction form a second angle that is different from ninety degrees;
   wherein the pinned layer is a synthetic antiferromagnet (SAF) including a first ferromagnetic layer having a first magnetization, a second ferromagnetic layer having a second magnetization, and a nonmagnetic layer between the first ferromagnetic layer and the second ferromagnetic layer, the second ferromagnetic layer being a reference layer.

27. The method of claim 26 wherein the free layer has a free layer magnetization biased in the first direction and wherein the second magnetization and the free layer magnetization form the second angle.

28. The method of claim 27 wherein the second angle is less than ninety degrees.

29. The method of claim 27 wherein the second angle is greater than ninety degrees.

* * * * *